US010838297B2

(12) United States Patent
Zhu et al.

(10) Patent No.: US 10,838,297 B2
(45) Date of Patent: Nov. 17, 2020

(54) METHOD OF MAKING A NANOSTRUCTURED CYLINDRICAL ROLL

(71) Applicant: 3M INNOVATIVE PROPERTIES COMPANY, St. Paul, MN (US)

(72) Inventors: James Zhu, Woodbury, MN (US); Daniel M. Lentz, Cottage Grove, MN (US); Karl K. Stensvad, Inver Grove Heights, MN (US); David J. Tarnowski, Mahtomedi, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 22 days.

(21) Appl. No.: 16/330,839

(22) PCT Filed: Sep. 12, 2017

(86) PCT No.: PCT/US2017/051146
§ 371 (c)(1),
(2) Date: Mar. 6, 2019

(87) PCT Pub. No.: WO2018/052895
PCT Pub. Date: Mar. 22, 2018

(65) Prior Publication Data
US 2019/0219919 A1 Jul. 18, 2019

Related U.S. Application Data

(60) Provisional application No. 62/395,518, filed on Sep. 16, 2016, provisional application No. 62/491,691, filed on Apr. 28, 2017.

(51) Int. Cl.
*G03F 7/00* (2006.01)
*B81C 1/00* (2006.01)
(Continued)

(52) U.S. Cl.
CPC ........ *G03F 7/0002* (2013.01); *B81C 1/00031* (2013.01); *C25F 3/14* (2013.01);
(Continued)

(58) Field of Classification Search
CPC . G03F 7/0002; C25F 7/00; C25F 3/14; B81C 1/00031; B81C 2201/0187; B82Y 40/00; B23H 9/04; B23H 3/04; H05K 3/07
See application file for complete search history.

(56) References Cited

U.S. PATENT DOCUMENTS

| 5,403,619 | A | 4/1995 | Cuomo |
| 7,615,179 | B2 * | 11/2009 | Dumond ............ B81C 99/0085 |
| | | | 216/67 |

(Continued)

FOREIGN PATENT DOCUMENTS

| CN | 102758226 | 10/2012 |
| WO | WO 2012-115635 | 8/2012 |

OTHER PUBLICATIONS

Jacobs, "Solid-state superionic stamping with silver iodide-silver metaphosphate glass", Nanotechnology, 2011, vol. 22, No. 42, pp. 425301(6pages).
(Continued)

*Primary Examiner* — Nahida Sultana
(74) *Attorney, Agent, or Firm* — James A. Baker

(57) ABSTRACT

A method of patterning a cylindrical tool, including providing a stamp including a base and a layer of solid state ionic conductor thereon, applying a negative of a predetermined pattern of features on a major surface of the solid state ionic conductor, providing a cylindrical tool having a metallic surface positioned proximate the stamp, and applying an electric field between the metallic surface and a cathode while moving the stamp against the metallic surface in rolling line contact so as to impart the predetermined pattern
(Continued)

of features onto the metallic surface, wherein the cathode is either the base or a conductive element positioned adjacent to the base. The positive of the predetermined pattern of features may include a multiplicity of nano-sized features.

19 Claims, 3 Drawing Sheets

(51) Int. Cl.
    *C25F 3/14*     (2006.01)
    *C25F 7/00*     (2006.01)
    *B82Y 40/00*     (2011.01)

(52) U.S. Cl.
    CPC ........ *C25F 7/00* (2013.01); *B81C 2201/0187* (2013.01); *B82Y 40/00* (2013.01)

(56) References Cited

U.S. PATENT DOCUMENTS

| | | |
|---|---|---|
| 7,998,330 B2 | 8/2011 | Fang |
| 9,956,720 B2 * | 5/2018 | Dow .................. B29C 33/3878 |
| 2007/0215480 A1 | 9/2007 | Fang |
| 2009/0050487 A1 | 2/2009 | Fang et al. |
| 2009/0283416 A1 | 11/2009 | Quenzer |
| 2011/0132768 A1 * | 6/2011 | Yang ..................... G03F 7/0002 205/127 |
| 2014/0096693 A1 * | 4/2014 | Kim .......................... B41C 1/08 101/153 |
| 2014/0268384 A1 * | 9/2014 | Taussig ............ B29D 11/00634 359/891 |
| 2015/0352834 A1 * | 12/2015 | Zwadlo ................. G03F 7/0002 101/335 |
| 2016/0031151 A1 | 2/2016 | Tan |

OTHER PUBLICATIONS

Tomasi, "Electric, thermodynamic and Nmr evidence of anomalies in (x)AgI(1-x) AgPO$_3$ glasses", Journal of Non-Crystalline Solids, 2001, vol. 293-295, pp. 785-791.

International Search Report for PCT International Application No. PCT/US2017/051146, dated Mar. 1, 2018, 5 pages.

* cited by examiner

METHOD OF MAKING A NANOSTRUCTURED CYLINDRICAL ROLL

CROSS REFERENCE TO RELATED APPLICATIONS

This application is a national stage filing under 35 U.S.C. 371 of PCT/US2017/051,146, filed Sep. 12, 2017, which claims the benefit of U.S. Application No. 62/395,518, filed Sep. 16, 2016; and U.S. Application No. 62/491,691, filed Apr. 28, 2017, the disclosure of which is incorporated by reference in its/their entirety herein.

FIELD

The present disclosure relates generally to the fabrication of cylindrical rolls having predetermined structured surface features, and more particularly to the formation of cylindrical rolls having predetermined nano-sized surface features using electrochemical patterning with a solid ionic conductor.

BACKGROUND

Cylindrical tool rolls are useful in diverse industrial operations, especially in roll-to-roll manufacturing. It is known to be able to produce structured patterns with length scales on the order of single micron and above. For example, diamond turning machines, which use a diamond to cut copper on a precision lathe, have been used to create micro-structured tooling. However, limitations with this technique exist because this method is fundamentally a turning operation.

Solid-state superionic stamping is an electrochemical patterning process of metallic films. The process begins with a solid electrolytic stamp that exhibits high ionic conductivity for a specific metal. When a pattern is to be created, the solid electrolytic stamp and the metallic film substrate are placed in contact. Pattern transfer is accomplished with the application of an electric field. The oxidation reaction at the film-stamp interface etches the metallic film through anodic dissolution. The resulting metal ions are transported through the solid state ionic conductor stamp to a counter electrode (e.g., a base) where the metal ions precipitate out through a balancing reduction reaction.

SUMMARY

In one aspect, the present disclosure describes a method of patterning a cylindrical tool, the method including providing a stamp comprising a base and a layer of solid state ionic conductor thereon, applying a negative of a predetermined pattern of features on a major surface of the solid state ionic conductor, providing a cylindrical tool having a metallic surface positioned proximate the stamp, and applying an electric field between the metallic surface and a cathode, wherein the cathode is either the base or a conductive element positioned adjacent to the base, while moving the stamp against the metallic surface in rolling line contact so as to etch the predetermined pattern onto the metallic surface, further wherein a portion of the metallic surface is oxidized, thereby generating metal ions and free electrons, additionally wherein said metal ions migrate through the solid state ionic conductor to the cathode where they are reduced, and moreover wherein the free electrons migrate to the metallic surface, thereby imparting a positive of the predetermined pattern to the metallic surface.

In certain exemplary embodiments, the positive of the predetermined pattern of features comprises a plurality of nano-sized features. The predetermined pattern may include a multiplicity of 3-dimensional relief structures.

Some convenient embodiments provide a compliant solid-state superionic stamp that spreads the contact pressure.

In certain convenient embodiments, the cylindrical tool is prepared (e.g., by diamond turning) to a surface roughness (Ra) of less than 0.05 µm, or even less than 0.02 µm. While any metallic surface is suitable, copper and silver are currently considered to be particularly useful.

In some convenient embodiments, applying the negative of the predetermined pattern on the major surface of the solid state ionic conductor may include directly laser machining the negative of the predetermined pattern on the major surface of the solid state ionic conductor, or patterning and etching the negative of the predetermined pattern on the major surface of the solid state ionic conductor. Known patterning techniques include nano-imprint lithography, photolithography, e-beam lithography, etc. Alternatively, the solid state ionic conductor may be patterned by contacting a major surface of a master template to the major surface of the solid state ionic conductor to emboss or cast the negative of the predetermined pattern on the major surface of the solid state ionic conductor. In certain such embodiments, such a master template includes a material selected from silicon (e.g., a silicon wafer), quartz, nickel or other metals, and combinations thereof. The predetermined pattern may be conveniently applied to the master template by e.g. e-beam lithography. In some convenient embodiments, the master template is a replicate of a previously mastered template. In some convenient embodiments the master template is porous so that it can be infused with electrolytic liquids and gels for treating the solid state ionic conductor.

LISTING OF EXEMPLARY EMBODIMENTS

A. A method of patterning a cylindrical tool, comprising:
providing a stamp comprising a base and a layer of solid state ionic conductor thereon;
applying a negative of a predetermined pattern of features to a major surface of the solid state ionic conductor;
providing a cylindrical tool having a metallic surface positioned proximate the stamp;
applying an electric field between the metallic surface and a cathode while moving the stamp against the metallic surface in rolling line contact so as to impart a positive of the predetermined pattern of features onto the metallic surface, wherein the cathode is either the base or a conductive element positioned adjacent to the base, further wherein a portion of the metallic surface is oxidized, thereby generating metal ions and free electrons, additionally wherein said metal ions migrate through the solid state ionic conductor to the cathode where they are reduced, and the free electrons migrate to the metallic surface, thereby imparting the positive of the predetermined pattern to the metallic surface.

B. The method of embodiment A, wherein the positive of the predetermined pattern of features comprises a plurality of nano-sized features.

C. The method of embodiment A or B, wherein the metallic surface has a surface roughness of less than 0.05 micrometers (µm).

D. The method of any one of embodiments A through C, wherein the metallic surface comprises one or more metals selected from the group consisting of silver, copper, chromium, titanium, gold, and combinations thereof.

E. The method of any one of embodiments A through D, wherein the predetermined pattern of features comprises a plurality of 3-dimensional relief structures.

F. The method of any one of embodiments A through E, further comprising creating a space in the base underneath at least a portion of the solid state ionic conductor, wherein the window exposes the side of the solid state ionic conductor opposite the pattern of features.

G. The method of embodiment F, further comprising pressurizing the space to maintain a contact pressure of the patterned surface of the solid state ionic conductor against the metallic surface.

H. The method of embodiment G, wherein the cathode defines a portion of the window, and the space is at least partially filled with an electrolytic liquid or gel.

I. The method of any one of embodiments A through H, wherein the solid state ionic conductor is a glassy ionic conductor.

J. The method of any one of embodiments A through I, further comprising measuring the current produced by the electric field and adjusting at least one of a speed of the rolling line contact, a force between the stamp and the metallic surface, an alignment between the stamp and the metallic surface, and a magnitude of the electric field, in response to the measurement.

K. The method of any one of embodiments A through J, wherein applying the negative of the predetermined pattern of features on the major surface of the solid state ionic conductor comprises laser machining the negative of the predetermined pattern of features on the major surface of the solid state ionic conductor, patterning and etching the negative of the predetermined pattern pf features on the major surface of the solid state ionic conductor, or contacting a major surface of a master template to the major surface of the solid state ionic conductor to emboss or cast the negative of the predetermined pattern of features on the major surface of the solid state ionic conductor.

L. The method of embodiment K, wherein the master template comprises a material selected from the group consisting of silicon, quartz, nickel, other metals, and combinations thereof.

M. The method of embodiment K or L, wherein the predetermined pattern is applied to the master template by electron-beam lithography.

N. The method of any one of embodiments A through M, further comprising disposing a first conductive interlayer between the ionic conductor and the base.

O. The method of embodiment N, wherein the first conductive interlayer comprises a conductive foil and a resilient layer.

P. The method of embodiment 0 wherein the first conductive interlayer comprises multiple conductive sections.

Q. The method of embodiments N through P further comprising disposing a second conductive interlayer adjacent to the first conductive interlayer.

R. The method of any of the previous embodiments, wherein the applying an electric field between the metallic surface and a cathode while moving the stamp against the metallic surface in rolling line contact so as to impart the predetermined pattern of features onto the metallic surface is performed in a first instance at a first position on the cylindrical tool, and in at least a second instance at a second position on the cylindrical tool.

S. The method of embodiment R, wherein the second position is selected from the group consisting of a position overlapping the first position, a position adjoining the first position, or a position separated from the first position.

T. The method of embodiment S, wherein second position is separated from the first position by a distance of no more than 2 µm.

U. The method of embodiment F, wherein the cathode defines a portion of the window, and the space is at least partially filled with an electrolytic elastomer.

V. The method of embodiment A, wherein the solid state ionic conductor is a polymeric ionic conductor.

W. The method of any of the previous embodiments, further comprising applying a fiducial mark to the metallic surface, wherein the fiducial mark has a pre-determined position relative to a position of the pre-determined pattern.

X. The method of embodiment W, wherein the applying of fiducial mark to the metallic surface is performed by the stamp.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1A:
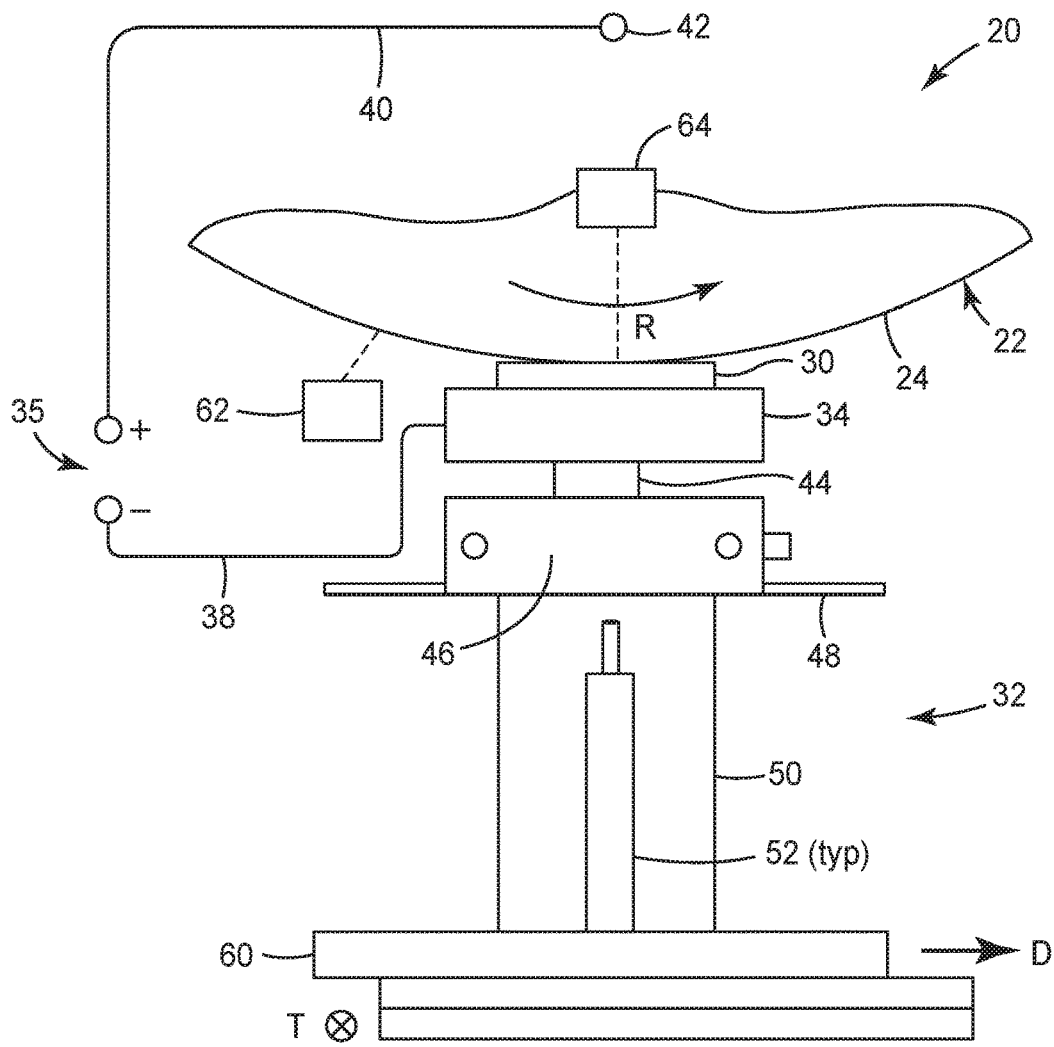
FIG. 1A is a schematic drawing of an apparatus including a cylindrical roll having a metallic surface and being about to pattern that metallic surface by rolling contact with a stamp prepared of the present disclosure.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

The present disclosure describes the formation of nano-sized features on a cylindrical roll.

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should understood that, as used herein:

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g., dendritic) copolymers.

The term "nano-sized" with respect to a feature means that the feature has at least one dimension in a defined direction that is less than one micrometer in length, preferably that the feature has at least two dimensions in two defined directions (which may be orthogonal to each other) that are each less than one micrometer in length, even more preferably that the feature has three dimensions in three defined directions (which may be orthogonal to each other) that are each less than one micrometer in length. Preferably, the nano-sized features have at least one dimension of at least one nanometer in length, and no more than 10 nm, 50 nm, 100 nm, 200 nm, 300 nm, 400 nm, 500 nm, 600 nm, 700 nm, 800 nm, or even 900 nm in length.

The term "rolling line contact" means that the stamp and the metallic surface are substantially in traction with each other with substantially no slip between them as they move. The actually areas in contact at any moment are thin with respect to the direction of motion. More particularly the width with respect to the direction of motion may be less than 5000 µm, or even less than 1000, 200, 50, or even 10 µm.

The term "adjoining" with reference to a particular layer means joined with or attached to another layer, in a position wherein the two layers are next to (i.e., adjacent to) and directly contacting each other.

By using terms of orientation such as "atop", "on", "over", "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means+/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g., visible light) than it fails to transmit (e.g., absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended exemplary embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g., 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof.

Exemplary Apparatus and Processes

Various exemplary embodiments of the disclosure will now be described with particular reference to the Drawings.

Referring now to FIG. 1A, a schematic drawing of an apparatus 20 including a cylindrical roll 22 having a metallic surface 24 about to be patterned by rolling contact with a stamp 30 supported on a support station 32, is illustrated. In achieving the rolling contact, roll 22 is rotated in direction "R" while stamp 30 is translated in direction "D." The speed of rotation in direction "R" is such that the tangential surface speed of metallic surface 24 equals the speed of motion in direction "D" so that there is no slippage at the point of contact.

Stamp 30 is supported by a chuck 34, which also transmits electric current from voltage source 36 via electrical conduit 38 to stamp 30. The anode of voltage source 36 is connected via electrical conduit 40 to the metallic surface 24, conveniently via the rotation shaft 42 of cylindrical roll 22. In other convenient embodiments, the electrical conduit 40 may directly electrify metallic surface 24.

Conveniently, chuck 34 is mounted on a force transducer 44 so that the contact force between stamp 30 and cylindrical roll 22 can be monitored. Force transducer 44 is conveniently mounted on a tilt platform 46, which is in turn mounted on a foundation 48. Foundation 48 is slidably mounted on a stand 50, with the position of foundation 48 controlled by a pair of actuators 52 (a second actuator being hidden on the far side of apparatus 20 in this Figure.) Pneumatic actuators, such as air bearing cylinders are considered convenient for this purpose. In some embodiments the actuators 52 are used for rough positioning, counterbalancing most of the gravitational force, while a voice coil is used to make the final contact and fine tune the applied force between the stamp 30 and the metallic surface 24. Stand 50 and actuators 52 are mounted on a linear motion stage 60. Drives are present to move rotation shaft 42 and linear motion stage 60, and these motions are coordinated so that the speed of rotation in direction "R" is such that the tangential surface speed of metallic surface 24 equals the speed of motion in direction "D" so that there is no slippage at the point of contact between metallic surface 24 and stamp 30.

A distance sensor 62 may be present, measuring the distance from itself to the exterior surface 24 of cylindrical roll 22. This sensor can be used to map the run-out on cylindrical roll 22. A positioning sensor 64 may be present, measuring the parallelism of chuck 34, allowing tilt platform 46 to be adjusted conveniently.

In the illustrated embodiment, linear motion stage 60 is itself mounted on a second linear motion stage 62 oriented so as to translate linear motion stage 60 and the rest of the apparatus 20 it supports in direction "T," perpendicular to direction "D" (into the plane of the picture). This allows additional instances of the pattern to be applied in a step-and-repeat fashion onto cylindrical roll 22 not only circumferentially, but also in a direction parallel with the axis of cylindrical roll 22.

Figure 1B:
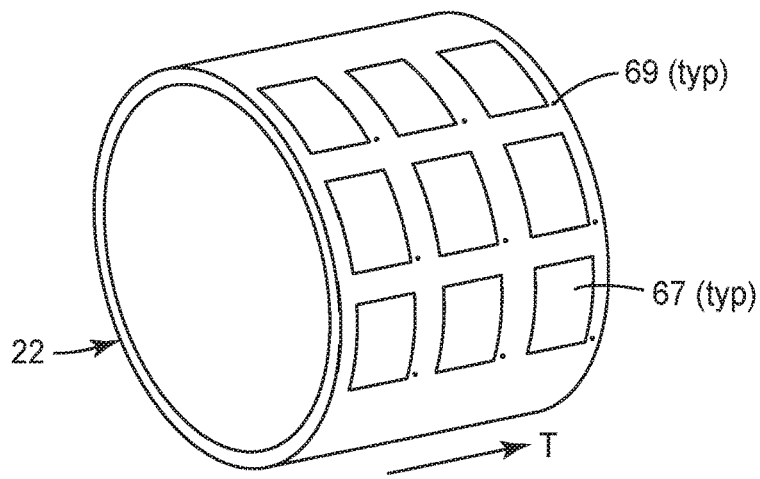
FIG. 1B is a perspective view of a cylindrical roll that has been patterned, viewed in isolation from the apparatus of FIG. 1A.

This embodiment is more readily illustrated in FIG. 1B, a perspective view of cylindrical roll 22 in isolation with nine instances of a pattern 67 laid down in a step-and-repeat fashion in a three by three array. The nine instances in the depicted embodiment are separated by a certain distance in either the circumferential direction or the axial direction, or both. However, it is contemplated in this disclosure that the instances of the pattern 67 could be immediately adjacent, or even deliberately overlapping. As will be discussed in the Examples below, it is possible to regulate a gap between adjacent instances of pattern 67 on cylindrical roll 22 with great accuracy, even to less than 2 μm.

Also seen in FIG. 1B are fiducial marks 69, each of which bear a specific positional relationship of one of the patterns 67. It is contemplated that fiducial marks 69 could be applied by the same stamp and at the same time as the pattern is applied by stamp 30 (in FIG. 1A). It is also possible that fiducial marks 69 could be applied in a separate operation. Such fiducial marks 69 are sometimes convenient when cylindrical roll 22 is used after patterning in, e.g., a roll-to-roll operation on a web and it is desirable to accurately register some secondary operation with the results of the cylindrical roll 22 upon that web.

Figure 2A:
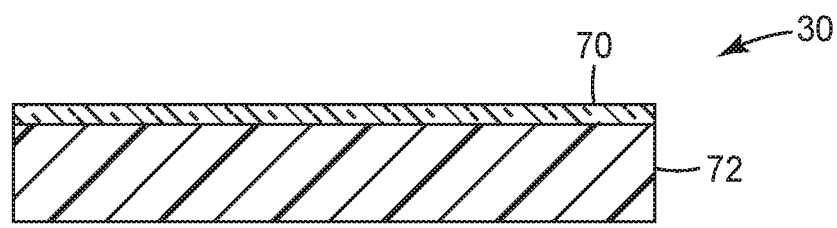
FIG. 2A is side cross sectional view of a stage in the formation of the stamp of FIG. 1A.

Referring now to FIG. 2A, a stage in the formation of the stamp 30 of FIG. 1A is illustrated. A stamp blank 24a has been fabricated by applying a thin film of an ionic conductor 70 onto a base 72. One convenient material to use as an ionic conductor is a glassy silver iodide-silver metaphosphate, $AgI_{(x)}$-$AgPO3_{(1-x)}$. This specialized glassy composite material exhibits high ionic conductivity as well as a low glass transition temperature of approximately 80-100° C. Additional information on this material can be found in an article by K. Jacobs, K. Hsu, X. Han, A. Kumar, B. Azeredo, N. Fang, P. Ferreira, "Solid-state superionic stamping with silver iodide-silver metaphosphate glass", *Nanotechnology*, vol. 22, no. 42, pp. 425301, 2011, which is hereby incorporated by reference as if rewritten. The application of this coating to the base 72 can be done in several ways, including a heated spin coating, sputtering, or thermal evaporation, or by heating to its glass transition temperature and compressing it while in contact with the stamp base.

Base 72 should preferably have some strength, and in some convenient embodiments is etchable or machinable. Since it is necessary to deliver electrical current to ionic conductor 70 it is sometimes convenient for base 72 to be conductive and deliver the current though base 72. Convenient materials include steels, Invar, and titanium. In some other embodiments, for example, where it is not convenient for the base 72 to be itself conductive, the current may be delivered to ionic conductor 70 directly, or via a conductive interlayer disposed between ionic conductor 70 and base 72. A conductive interlayer may comprise a conductive foil in contact with the ionic conductor, and a resilient layer adjacent to the conductive foil. The resilient layer provides a helpful compliance when the ionic conductor contacts the metallic surface of the cylindrical roll.

One suitable interlayer comprises graphite paper tape as the conductive foil above a thin layer of rubber as the resilient layer. In some embodiments, the conductive layer and resilient layer may be combined into a single compliant conductive layer, e.g. carbon loaded conductive rubber. In some embodiments the resilient layer may comprise a fluid or gas layer able to maintain a defined pressure. In some embodiments, the conductive interlayer may comprise multiple conductive sections to allow for independent control of pattern transfer rates in different parts of the surface of the patterned ionic conductor. In some embodiments a second conductive interlayer may be present adjacent to the first conductive interlayer for the sensing of the local electric field. In such embodiments the sensing of the local electric field may facilitate fine control of the field exerted by the first conductive interlayer.

Suitable non-conductive bases include silicon, glass, and quartz and combinations thereof.

Figure 2B:
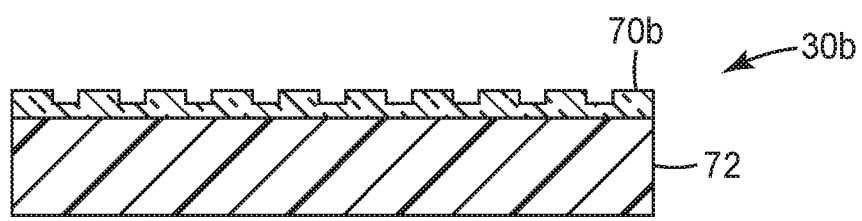
FIG. 2B is another stage in the formation of the stamp of FIG. 1A.

Referring now to FIG. 2B, another stage in the formation of a stamp 30b is illustrated. A predetermined pattern has been imposed upon ionic conductor 70 from FIG. 2A, creating patterned ionic conductor 70b. Since the ionic conductor preferably has a low glass transition temperature, for example less than 100 degrees C., or even 80 degrees C., this predetermined pattern may be formed by low temperature thermoforming against a master tool formed from e.g., a silicon wafer. To aid in delamination, the master patterned template can optionally be treated with a release coating to decrease the forces during separation. If separation is not possible through mechanical means, the master wafer can be selectively etched away. Alternatively, techniques such as focused ion beam machining or laser ablation can also be used to directly pattern the ionic conductor 70 (FIG. 2A).

Figure 2C:
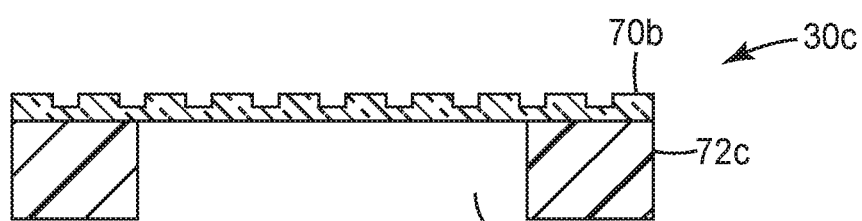
FIG. 2C is another stage in the formation of the stamp of FIG. 1A.

Referring now to FIG. 2C, another stage in the formation of a stamp 30c is illustrated. In this optional stage, a backside etch is performed to create a window 80 on the base 72 in FIG. 2B, forming windowed base 72c. The window 80 exposes the backside of patterned ionic conductor 70b. As will be discussed further below, such a construction allows the patterned ionic conductor 70b to make compliant contact with the cylindrical roll 22 of FIG. 1A. With compliant contact, the contact force may be safely reduced and the transfer of the pattern on the stamp to the cylindrical roll can be done with higher fidelity. To ensure bending stresses are minimized, the total thickness of the ionic conductor is conveniently minimized. In some embodiments the thickness of the ionic conductor covering the window can be less than 2000 μm, or even less than 500, 100, 30, or even 10 μm. In embodiments where the base 72 is a silicon wafer, this backside etch can be performed lithographically with an anisotropic KOH etch. Alternatively, the window can, e.g., be carefully machined.

Figure 2D:
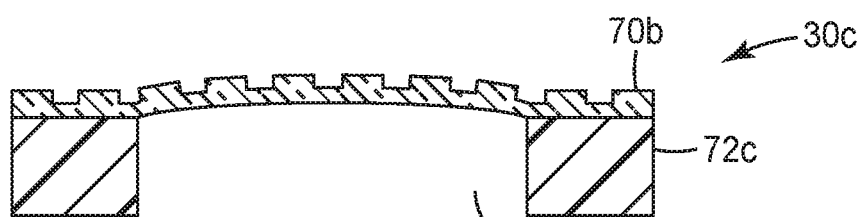
FIG. 2D is another stage in the formation of the stamp of FIG. 1A.

Referring now to FIG. 2D, another stage in the formation of stamp 24 of FIG. 1A is illustrated. In embodiments where window 80 is present, when the stamp 30c is used the window 80 has been provided with a fluid at a pressure slightly higher than ambient so that the patterned surface of patterned ionic conductor 30b will contact the metallized surface with a more uniform pressure.

Figure 2E:
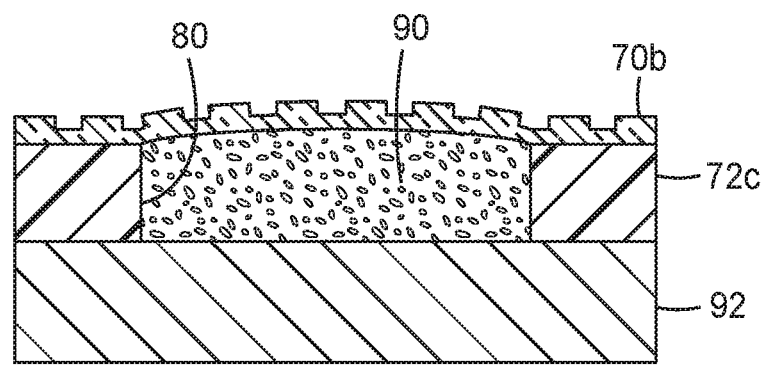
FIG. 2E is a side cross-sectional view similar to FIG. 2D except that the window is filled with a conductive liquid, so that electrochemical deposition occurs at a separate cathode.

Referring now to FIG. 2E, a view similar to FIG. 2D except that the window 80 is filled with an ionically conductive liquid 90, so that the electrochemical deposition occurs at a separate cathode 92.

Figure 3:
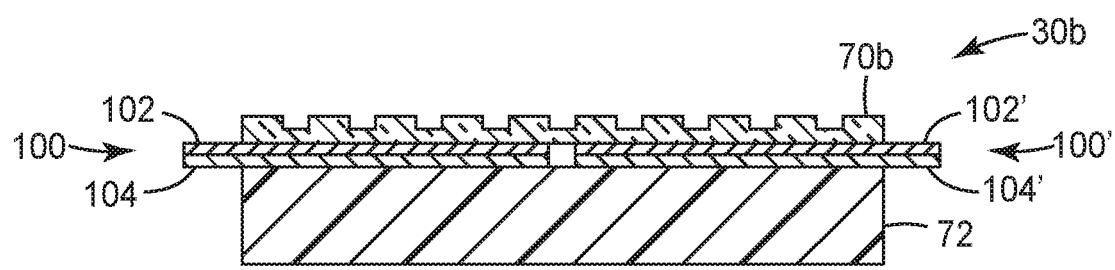
FIG. 3 is a side cross sectional view of another exemplary embodiment of the stamp of FIG. 1A, showing an alternate embodiment of the stamp illustrated in FIG. 2B.

Referring now to FIG. 3, a cross section view of an alternate embodiment of a stamp 30b similar to the one illustrated in FIG. 2B is shown. In this embodiment, a conductive interlayer 100 is disposed between patterned ionic conductor 70b and base 72. The depicted conductive interlayer 100 comprise a conductive foil 102 in contact with the patterned ionic conductor 70b, and a resilient layer 104 adjacent to the conductive foil 102. The resilient layer provides a helpful compliance when the ionic conductor contacts the metallic surface of the cylindrical roll. In the depicted embodiment, the conductive interlayer may comprise multiple conductive sections, e.g. 100',102', and 104' to allow for independent control of pattern transfer rates in different parts of the surface of the patterned ionic conductor 70b.

The operation of certain exemplary embodiments of the present disclosure will be further described with regard to the following non-limiting detailed Examples. These Examples are offered to further illustrate the various specific and preferred embodiments and techniques. It should be understood, however, that many variations and modifications may be made while remaining within the scope of the present disclosure.

EXAMPLES

The following Examples are merely for illustrative purposes and are not meant to be overly limiting on the scope of the appended claims.

Example 1

An apparatus generally as depicted in FIG. 1A was fabricated. The cylindrical roll is 12.75 inches in diameter, and is constructed of aluminum. After diamond turning to true the circularity, a thin layer of silver is deposited on the exterior surface. The stamp is held by a vacuum chuck. A force transducer commercially available as MLP-50 from Transducer Techniques of Temecula, Calif., is positioned under the vacuum chuck. The force transducer is mounted on a five-axis platform commercially available from Thorlabs of Newton, N.J.

The platform is mounted on a foundation disposed on for sliding motion on a stand. A pair of pneumatic actuators, commercially available as AIRPEL-AB from Airpot Corporation of Norwalk, Conn., support the foundation. The stand is mounted on a linear motion stage.

The stamp is prepared by depositing a layer of glassy silver iodide-silver metaphosphate, $AgI_{(x)}$-$AgPO3_{(1-x)}$ onto a base in the form of a silicon wafer. Information on melting profiles useful in this operation can be found in an article by C. Tomasi, P. Mustarelli, A. Magistris, M. Garcia, "Electric, thermodynamic and NMR evidence of anomalies in (x)AgI (1-x)AgPO3 glasses," *J. Non-Cryst Solids*, vol. 293-295, pp. 785-791, 2001, which is hereby incorporated by reference as if rewritten. A pattern having nano-sized features is impressed onto the glassy ionic conductor by low temperature thermoforming against a master tool formed from a silicon wafer.

A window is formed within the base by a backside etch with KOH. The window is then filled with an ionically conductive hydrogel. The filled window is then sealed against a metallic cathode. A gentle pressure is applied to the hydrogel to urge the glassy ionic conductor towards the cylindrical roll. Air pressure is applied to the pneumatic actuators to urge the chuck towards the cylindrical roll, just sufficient to counterbalance the weight of the upper portions of the apparatus. A voice coil is used to make the final adjustment of the contact pressure between the ionic conductor and the metallic surface. The linear motion stage is set in motion, and the cylindrical roll is also set in motion so that the contact between the stamp and the metallic surface of the cylindrical roll are in traction with each other. A potential difference is applied between the metallic surface and the cathode with a potentiostat operated in chronoamperometry mode. A current on the order of microamps is thereby generated, causing silver to the electrochemically etched from the metallic surface and correspondingly deposited on the cathode. A high resolution copy of the predetermined pattern is thereby formed on the metallic surface.

Example 2

An experiment generally similar to Example 1 is performed, except with regard to the construction of the stamp. In this Example, the base is not windowed, rather a conductive interlayer is disposed between the glassy ionic conductor and the base. This conductive interlayer is formed from a conductive layer of graphite paper tape (commercially available from Wale Apparatus of Hellertown, Pa.) above a resilient layer of thin rubber.

Example 3

An experimental set up generally similar to Example 2 was prepared, except with regard to the following particulars. The glassy ionic conductor was unpatterned. The surface of the cylindrical roll was not silvered, but rather a sheet of polyethylene phthalate (PET) film with a thin layer of silver vapor deposited on one side was adhered to the cylindrical roll with the silvered side outwards. Once it had been verified that the silvered side was electrically isolated by the PET film from the aluminum of the cylindrical roll, the silvered side was electrically connected to the positive terminal of the potentiostat. The negative terminal of the potentiostat was connected to the conductive interlayer, and the potentiostat was used to electrically bias the stamp to a potential difference of 0.4 Volt relative to the silvered side prior to placing the silvered side and the glassy ionic conductor into physical contact.

Air pressure was applied to the pneumatic actuators to urge the chuck towards the cylindrical roll, just sufficient to counterbalance the weight of the upper portions of the apparatus. A voice coil was used to make the final adjustment of the contact pressure between the ionic conductor and the metallic surface. The cylindrical roll was set in motion at a 0.5 degree/second, and the linear motion stage was set in motion at a speed so that the contact between the stamp and the silvered surface were in traction with each other. The current passed by the potentiostat during this motion was graphed and found to be between 5 and 10 microamps, and a total of 371 microCoulombs was passed over a period of 24 seconds.

Example 4

An experimental set up generally similar to Example 3 was prepared, except with regard to the following particulars. The cylindrical roll was set in motion at a 0.25 degree/second, and the linear motion stage was set in motion at a speed so that the contact between the stamp and the silvered surface were in traction with each other. The current passed by the potentiostat during this motion was graphed and found to be between 5 and 10 microamps, and a total of 457 microCoulombs was passed over a period of 49 seconds. Examples 3 and 4 suggest that the monitoring of current should be a viable method for monitoring the process, providing a quality control measure.

Example 5

An experiment set up generally according to Example 2 was prepared, except that with regard to the following particulars. After the first high resolution copy of the pre-determined pattern was formed on the metallic surface, the circumferential position of the stamp relative to the cylindrical roll was returned to its starting condition, and the stamp was indexed in the "T" direction by slightly more than the width of the stamp. The stamping process was repeated to form a second instance of the pre-determined pattern on the metallic surface. The gap between the first and second patterns on the metallic surface was held to less than 2 microns.

Example 6

An experiment set up generally according to Example 2 was prepared, except that with regard to the following particulars. The stamp was provided so as to place a fiduciary mark on the metallic surface, the mark having a known positional relationship to the pre-determined pattern.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

The invention claimed is:

1. A method of patterning a cylindrical tool, comprising:
providing a stamp comprising a base and a layer of solid state ionic conductor thereon;
applying a negative of a predetermined pattern of features to a major surface of the solid state ionic conductor, wherein the stamp further comprises a window comprised of a space in the base underneath at least a portion of the solid state ionic conductor, wherein the window exposes a side of the solid state ionic conductor opposite the negative of the predetermined pattern;
providing a cylindrical tool having a metallic surface positioned proximate the stamp;
applying an electric field between the metallic surface and a cathode while moving the stamp against the metallic surface in rolling line contact so as to impart the predetermined pattern of features onto the metallic surface, wherein the cathode is either the base or a conductive element positioned adjacent to the base, and further wherein a portion of the metallic surface is oxidized, thereby generating metal ions and free electrons, additionally wherein said metal ions migrate through the solid state ionic conductor to the cathode where they are reduced, and the free electrons migrate to the metallic surface, thereby imparting a positive of the predetermined pattern of features to the metallic surface.

2. The method of claim 1, wherein the positive of the predetermined pattern of features comprises a plurality of nano-sized features.

3. The method of claim 1, wherein the metallic surface has a surface roughness of less than 0.05 µm.

4. The method of claim 1, wherein the metallic surface comprises one or more metals selected from the group consisting of silver, copper, chromium, titanium, gold, and combinations thereof.

5. The method of claim 1, wherein the predetermined pattern of features comprises a plurality of 3-dimensional relief structures.

6. The method of claim 1, further comprising pressurizing the space to maintain a contact pressure of the patterned surface of the solid state ionic conductor against the metallic surface.

7. The method of claim 6, wherein the cathode defines a portion of the window, and the space is at least partially filled with an electrolytic liquid or gel.

8. The method of claim 1 wherein the solid state ionic conductor is a glassy ionic conductor.

9. The method of claim 1, further comprising measuring the current produced by the electric field and adjusting at least one of a speed of the rolling line contact, a force between the stamp and the metallic surface, an alignment between the stamp and the metallic surface, and a magnitude of the electric field, in response to the measurement.

10. The method of claim 1, wherein applying the negative of the predetermined pattern of features on the major surface of the solid state ionic conductor comprises at least one of: laser machining the negative of the predetermined pattern of features on the major surface of the solid state ionic conductor, patterning and etching the negative of the predetermined pattern of features on the major surface of the solid state ionic conductor, or contacting a major surface of a master template to the major surface of the solid state ionic conductor to emboss or cast the negative of the predetermined pattern of features on the major surface of the solid state ionic conductor.

11. The method of claim 1 further comprising disposing a first conductive interlayer between the ionic conductor and the base.

12. The method of claim 11, wherein the first conductive interlayer comprises a conductive foil layer and a resilient layer.

13. The method according to claim 12, wherein the first conductive interlayer comprises multiple conductive sections.

14. The method according to claim 13, further comprising disposing a second conductive interlayer adjacent to the first conductive interlayer.

15. The method of claim 1, wherein the applying an electric field between the metallic surface and a cathode while moving the stamp against the metallic surface in rolling line contact so as to impart the predetermined pattern of features onto the metallic surface is performed in a first instance at a first position on the cylindrical tool, and in at least a second instance at a second position on the cylindrical tool.

16. The method of claim 15, wherein the second position is selected from the group consisting of a position overlapping the first position, a position adjoining the first position, or a position separated from the first position.

17. The method of claim 15, wherein second position is separated from the first position by a distance of no more than 2 μm.

18. The method of claim 1, wherein the solid state ionic conductor is a polymeric ionic conductor.

19. The method of claim 1, further comprising applying a fiducial mark to the metallic surface, wherein the fiducial mark has a pre-determined position relative to a position of the pre-determined pattern, optionally wherein the applying of the fiducial mark to the metallic surface is performed by the stamp.

\* \* \* \* \*